United States Patent
Kline

(10) Patent No.: US 6,927,593 B2
(45) Date of Patent: Aug. 9, 2005

(54) SYSTEM FOR TESTING SEMICONDUCTOR DIE ON MULTIPLE SEMICONDUCTOR WAFERS

(75) Inventor: Jerry D. Kline, Argyle, TX (US)

(73) Assignee: Eaglestone Partners I, LLC, Long Beach, CA (US)

(*) Notice: Subject to any disclaimer, the term of this patent is extended or adjusted under 35 U.S.C. 154(b) by 0 days.

(21) Appl. No.: 10/860,679

(22) Filed: Jun. 3, 2004

(65) Prior Publication Data

US 2004/0217772 A1 Nov. 4, 2004

Related U.S. Application Data

(62) Division of application No. 09/629,326, filed on Jul. 31, 2000, now Pat. No. 6,822,469.

(51) Int. Cl.[7] .......................... G01R 31/28; H01L 21/66
(52) U.S. Cl. .......................... 324/765; 324/760; 438/17
(58) Field of Search ........................ 324/158.1, 754, 324/758, 760, 761, 765; 257/690, 698, 700; 438/14, 17

(56) References Cited

U.S. PATENT DOCUMENTS 5,600,257 A * 2/1997 Leas et al. .................. 324/754
5,707,881 A * 1/1998 Lum ........................... 438/15
6,094,060 A * 7/2000 Frankeny et al. ........... 324/760

* cited by examiner

Primary Examiner—Ernest Karlsen
(74) Attorney, Agent, or Firm—Lawrence R. Youst; Danamraj & Youst, P.C.

(57) ABSTRACT

A system for testing semiconductor die on multiple semiconductor wafers includes a testing unit (82), a test fixture bank (84) operably coupled to the testing unit (82), a plurality of test fixture racks (86–92) operably coupled to the test fixture bank (84) and a plurality of wafer-interposer assemblies (94–140) operably coupled to each of the test fixture racks (86–92). Each of the wafer-interposer assemblies (94–140) includes a semiconductor wafer having a plurality of semiconductor die and an interposer coupled to the semiconductor wafer. The interposer has a first set of conductors for electrically connecting the semiconductor die of the semiconductor wafer to a substrate and a second set of conductors that electrically connect the semiconductor die of the semiconductor wafer to the test fixture rack (86–92) via a connector, thereby providing for addressing and testing of the semiconductor die.

29 Claims, 6 Drawing Sheets

SYSTEM FOR TESTING SEMICONDUCTOR DIE ON MULTIPLE SEMICONDUCTOR WAFERS

CROSS-REFERENCE TO RELATED APPLICATION

This is a divisional application of application Ser. No. 09/629,326 now U.S. Pat. No. 6,822,469, entitled "Method for Testing Multiple Semiconductor Wafers," filed on Jul. 31, 2000, in the name of Jerry D. Kline.

TECHNICAL FIELD OF THE INVENTION

The present invention relates generally to the field of integrated circuits, and more particularly, to a system for testing semiconductor die on multiple semiconductor wafers and high-density packaging of semiconductor dies.

BACKGROUND OF THE INVENTION

Semiconductor die have traditionally been electrically connected to a package by wire bonding techniques, in which wires are attached to pads of the die and to pads located in the cavity of the plastic or ceramic package. Wire bonding is still the interconnection strategy most often used in the semiconductor industry today. But the growing demand for products that are smaller, faster, less expensive, more reliable and have a reduced thermal profile has pushed wire bonding technology to its limits (and beyond) thereby creating barriers to sustained product improvement and growth.

The high-performance alternative to wire bonding techniques are flip chip techniques, in which solder balls or bumps are attached to the input/output (I/O) pads of the die at the wafer level. The bumped die is flipped over and attached to a substrate "face down," rather than "face up" as with wire bonding. Flip chips resolve many if not all of the problems introduced by wire bonding. First, flip chips have fewer electrical interconnects than wire bonding, which results in improved reliability and fewer manufacturing steps, thereby reducing production costs. Second, the face down mounting of a flip chip die on a substrate allows superior thermal management techniques to be deployed than those available in wire bonding. Third, flip chips allow I/O to be located essentially anywhere on the die, within the limits of substrate pitch technology and manufacturing equipment, instead of forcing I/O to the peripheral of the die as in wire bonding. This results in increased I/O density and system miniaturization.

Despite the advantages of the flip chip, wide spread commercial acceptance of the flip chip has been hindered by testing issues. To ensure proper performance, the die should be adequately tested before it is assembled into a product; otherwise, manufacturing yields at the module and system level can suffer and be unacceptably low. Under some circumstances, a defective die can force an entire subassembly to be scrapped. One attempt to address this testing issue has been to perform a wafer probe, followed by dicing the wafer and temporarily packaging each die into a test fixture of some sort. Performance testing is subsequently executed. Burn-in testing is often included in this process to eliminate any die having manufacturing process defects. Following the successful completion of these tests, the die are removed from the test fixture and either retailed as a Known Good Die ("KGD") product or used by the manufacturer in an end product, such as a Multichip Module ("MCM"). The Multichip Module may constitute a subassembly in a larger system product. This Known Good Die process is inherently inefficient due to its complexity.

Accordingly, there is a need for a system, method and apparatus for testing multiple semiconductor wafers that is simple, allows testing at the wafer level before dicing, and eliminates the need for temporarily packaging the die in a carrier.

SUMMARY OF THE INVENTION

The present invention provides a system, method and apparatus for testing multiple semiconductor wafers that is simple, allows testing at the wafer level before dicing, and eliminates the need for temporarily packaging the die in a carrier. As a result, the number of manufacturing operations are reduced, thereby improving first pass yields. In addition, manufacturing time is decreased, thereby improving cycle times and avoiding additional costs.

More specifically, the present invention provides several possible test systems, apparatus and methods of interfacing multiple semiconductor wafer to the testing equipment through the use of interposer assemblies, which enhances economies of scale. The interposer revolutionizes the semiconductor fabrication process enabling testing and burn-in of all die at the wafer level. For example, the interposer eliminates the need to singulate, package, test, then unpackage each die individually to arrive at a Known Good Die product stage. Furthermore, the interposer may remain attached to the die following dicing, thereby providing the additional benefit of redistributing the die I/O pads to a standard Joint Electrical Dimensional Electronic Committee ("JDEC") interconnect pattern for Direct Chip Attachment ("DCA") applications.

The present invention provides a system for testing semiconductor die on multiple semiconductor wafers that includes a test fixture rack having connectors and at least two wafer-interposer assemblies. Each of the wafer-interposer assemblies includes a semiconductor wafer having a plurality of semiconductor die and an interposer coupled to the semiconductor wafer. The interposer has a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

In one embodiment, the test fixture rack may include discrete devices for enhancing testing of the semiconductor die and may include display devices that indicate a parameter associated with testing of the semiconductor die. In another embodiment, the test fixture rack may include a handle or a positioning guide. The test fixture rack may be operably coupled to a testing unit that performs testing of at least a portion of the semiconductor die including parametric testing, sequential testing, simultaneous testing, vibrational and mechanical stress testing or the like.

In another aspect, the present invention provides a system for testing semiconductor die on multiple semiconductor wafers that includes a test fixture bank, at least two test fixture racks operably coupled to the test fixture bank, each of the test fixture racks having connectors and at least two wafer-interposer assemblies operably coupled to each of the test fixture racks. Each of the wafer-interposer assemblies includes a semiconductor wafer having a plurality of semiconductor die and an interposer coupled to the semiconductor wafer. The interposer has a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

In a further aspect, the present invention provides a system for testing semiconductor die on multiple semiconductor wafers that includes a testing unit, a test fixture bank operably coupled to the testing unit, at least two test fixture racks operably coupled to the test fixture bank, each of the test fixture racks having connectors and at least two wafer-interposer assemblies operably coupled to each of the test fixture racks. Each of the wafer-interposer assemblies includes a semiconductor wafer having a plurality of semiconductor die and an interposer coupled to the semiconductor wafer. The interposer has a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed herein in terms of a multiple semiconductor wafer testing system, it should be appreciated that the present invention provides many applicable inventive concepts which can be embodied in a wide variety of specific contexts. The specific embodiments discussed herein are merely illustrative of specific ways to make and use the invention and does not limit the scope of the invention.

The present invention provides a system, method and apparatus for testing multiple semiconductor wafers that is simple, allows testing at the wafer level before dicing, eliminates the need for temporarily packaging the die in a carrier, and allows for simultaneous or near simultaneous testing multiple wafer-interposer assemblies. As a result, the number of manufacturing operations are reduced, thereby improving first pass yields. In addition, manufacturing time is decreased, thereby improving cycle times and avoiding additional costs.

Moreover, the present invention provides several possible test systems, apparatus and methods of interfacing multiple semiconductor wafer to the testing equipment through the use of interposer assemblies, which enhances economies of scale. The interposer revolutionizes the semiconductor fabrication process enabling testing and burn-in of all die at the wafer level. For example, the interposer eliminates the need to singulate, package, test then unpackage each die individually to arrive at a Known Good Die product stage. This results in a significant cost avoidance opportunity for wafer manufacturers. Furthermore, the interposer may remain attached to the die following dicing, thereby providing the additional benefit of redistributing the die I/O pads to a standard Joint Electrical Dimensional Electronic Committee ("JDED") interconnect pattern for Direct Chip Attachment ("DCA") applications.

Figure 1:
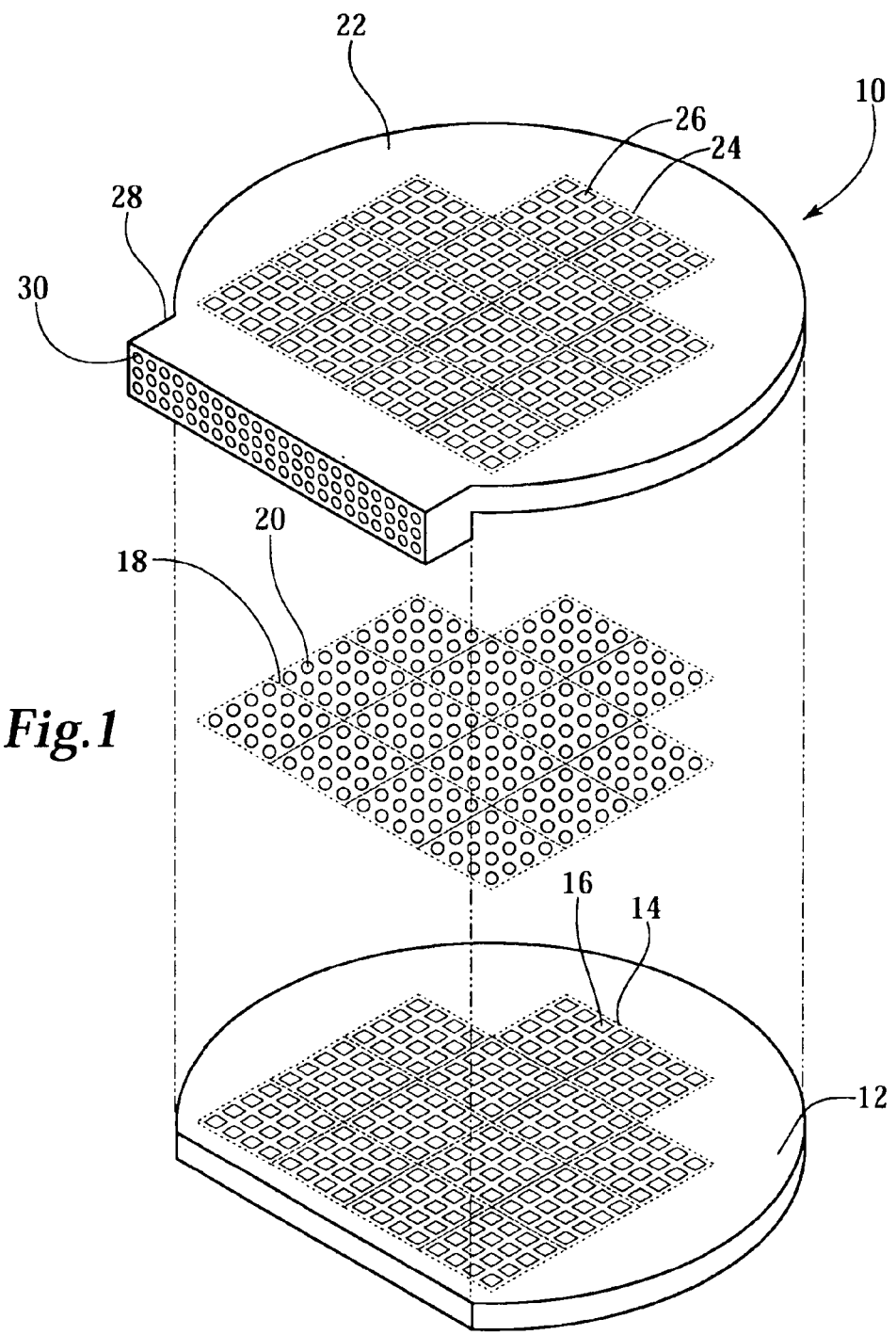
FIG. 1 is an exploded view of a wafer-interposer assembly in accordance with the present invention.

The general features of a wafer-interposer assembly, generally designated 10, in accordance with the present invention are shown in FIG. 1. A wafer-interposer assembly 10 comprises a wafer 12 having one or more chips 14 therein. Wafer 12 is depicted as having eighteen chips 14 for simplicity that are separated by dashed lines for clarity. Each chip 14 has one or more conductive pads 16 on its surface. For each chip 14 there is a corresponding array 18 of conductive attachment elements 20 one for each conductive pad 16. The conductive attachment elements 20 may be solder balls or bumps, screened solder paste, a set of conductive two part or heat cured epoxy, conductive thermoplastic balls or bumps or other electrical connection methods known in the art.

The interposer 22 has an array 24 of conductive pads 26 on the surface facing away from the wafer 12. The interposer 22 also has an array of conductive pads (not shown) on the surface facing the wafer 12, one for each conductive pad 16 on the surface of the wafer 12. After assembly, the conductive attachment elements 20 electrically connect and mechanically bond the pads 16 of each chip 14 to the facing interposer pads (not shown).

The interposer 22 is preferably directly and permanently attached to the wafer 12, thereby eliminating the wafer-bumping step currently required for Flip chip and Flip chip/DCA applications. Alternately, the interposer 22 may be created by application of materials on the wafer 12 itself, such as ink jet deposition of conductive epoxy, solder or polyimide. These materials can also be rolled on, sprayed on or applied through stereolithographic technologies. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the interposer 22.

Figure 2:
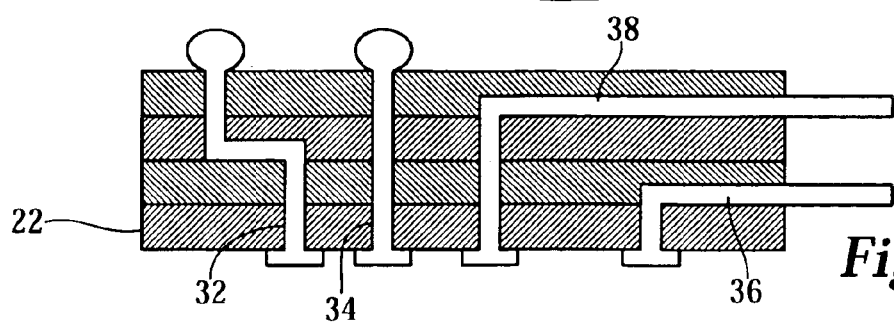
FIG. 2 is a cross-sectional view of an interposer in accordance with the present invention.

As best seen in FIG. 2, interposer 22 includes one or more layers having etched routing lines and vias therein which serve as electrical conductors. One set of conductors, depicted as conductors 32 and 34 pass through the interposer 22 to electrically connect the pads 16 on the chips 14 to the pads of a substrate to which the chip assembly will be attached as explained in more detail below. Conductors 32 and 34 are selected to have suitable conductivity and may be, for example, copper.

Testing conductors, depicted as conductors 36 and 38 pass through the interposer 22 connecting the pads 16 of the chips 14 to the testing sockets 30 in the testing connector 28, as best seen in FIG. 1. The testing conductors 36 and 38 may provide direct electrical connection between the testing sockets 30 and the pads 16, or may pass through a multiplexer or other intervening apparatus (not shown) incorporated into the interposer 22. As a result, the interposer 22 electrically connects all relevant nodes to standard test equipment without the need for probes.

Assembly of the wafer 12 and interposer 22 is accomplished through creating a set of permanent electrical and mechanical connections between the wafer 12 and interposer 22 using the conductive attachment elements 20. The conductive attachment elements 20 will typically be implemented as features on both the upper and lower surfaces of the interposer 22 but may alternatively be placed on the wafer 12. Likewise, the attachment elements 20 could be incorporated into a sheet or similar structure sandwiched between the wafer 12 and interposer 22 during assembly.

In order to test the chips 14 using the interposer 22, it will be necessary that a testing apparatus be able to connect to the full array of pads 16 on each chip 14 through the testing connector 28. For a wafer 12 having a substantial number of chips 14, each having a large number of pads 16, it may be desirable to connect the pads 16 to the testing sockets 30 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14. Such a design removes the necessity for a dedicated testing socket 30 for each chip pad 16, thereby reducing the complexity of the testing connector 28.

While FIG. 1 depicts an interposer 22 having a single, rectangular testing connector 28, it should be understood by those skilled in the art that interposer 22 could be attached to a testing apparatus in a variety of ways. For example, interposer 22 may have multiple testing connectors having various sizes, shapes and numbers of sockets. Likewise, interposer 22 may alternatively have testing connectors mounted on the top surface thereof instead of or in addition to the side mounted testing connectors or may use cables for connection to a testing apparatus.

It should also be noted that interposer 22 may include bypass capacitors to minimize ground bounce and to filter bias voltage. These capacitors may be standard surface mount devices or embedded within interposer 22. Additionally, interposer 22 may include inductors to provide additional filtering. Impedance matching networks and line drivers may also be incorporated into interposer 22 to ensure signal integrity and to accurately measure parameters such as signal rise time and bandwidth and to protect the semiconductor chips 14 in the event of test equipment failure.

The pads 26 on the upwardly facing surface of interposer 22 are depicted in FIG. 1 having the identical geometry as the pads 16 of the chips 14 of the wafer 12. The invention herein disclosed is by no means limited to this geometry. As each die design may have unique pad geometry, one of the advantages of the present invention is that pads 26 of interposer 22 may utilize a geometry that is different than that of chips 14. Traditionally, chip designers were limited in chip layout in that all connections between the elements of the chip 14 and the outside world had to be made either through the peripheral edges of the chip (for wire bonding) or at least through a standard pin or pad layout defined by a standardization body, such as the Joint Electrical Dimensional Electronic Committee (JEDEC). The interconnection requirements, therefore, have traditionally driven the chip layout.

Through the use of the interposer 22, the layout of a chip 14 and its pads 16 can be defined according to the interaction of the functional elements of the chip 14 rather than according to the standardization requirements. The interposer 22 can be designed with a standardized layout of pads 26 on its upper surface and can electrically connect each chip pad 16 to the corresponding upper interposer pad 26 without an interposer pad 26 being directly above its corresponding chip pad 16. Not only does the interposer 22 of the present invention provide for standardized interconnection, it also provides for the use of standard test hardware, software, cabling and connectors compatible with existing industry infrastructure.

An additional advantage of interposer 22 of the present invention is that more than one interposer 22 can be designed for each wafer 12. A manufacturer can then, by substituting a different interposer 22, modify the layout of the output pads 16 to conform to a different layout or packaging standard. Alternatively, if the chip 14 and interposer 22 are designed for modularity, a single interposer design may be useful on more than one chip design. A specific interposer design will typically be necessary for each unique wafer design.

Figure 3:
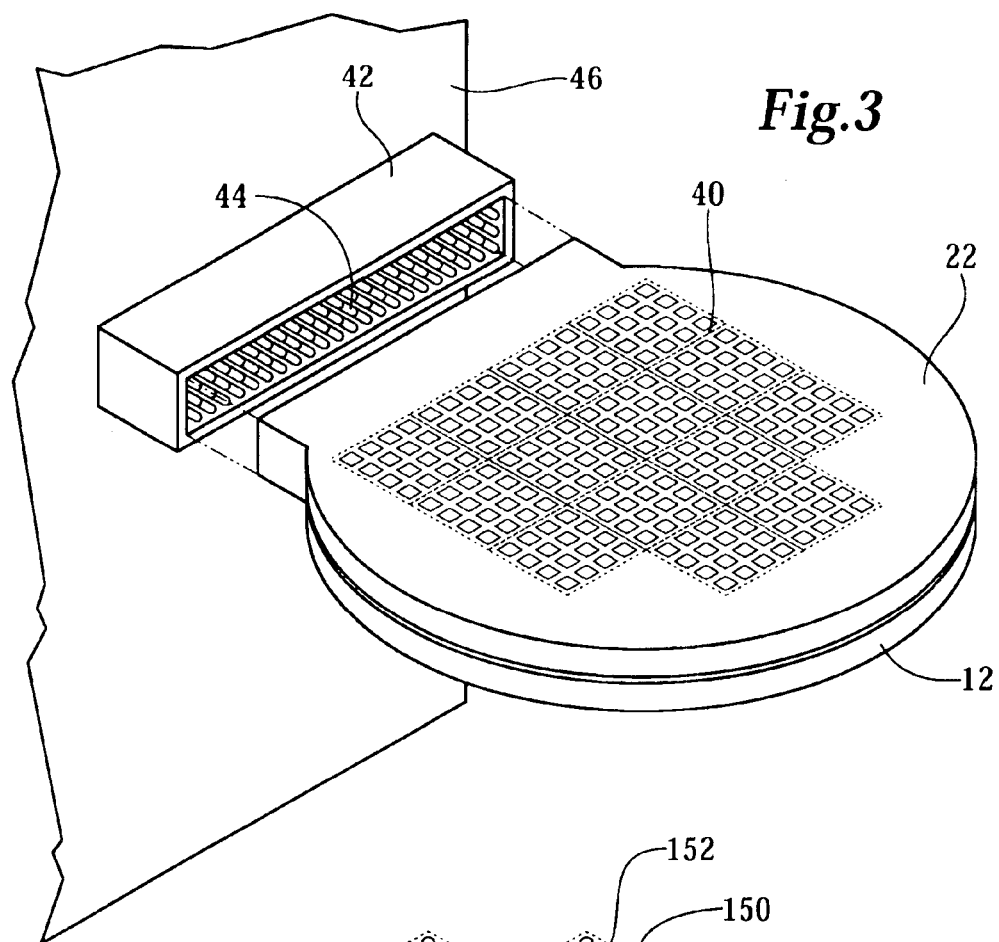
FIG. 3 is a perspective view of a wafer-interposer assembly being inserted into a testing apparatus in accordance with the present invention.

Turning now to FIG. 3, a wafer 12 and interposer 22 are shown as an assembly 40 ready to be connected to a testing unit 46 in accordance with the present invention. The wafer-interposer assembly 40 interfaces to the testing unit 46 through a testing connector 42 comprising one or more testing contacts 44, shown here as pins. The testing contacts 44 in the testing connector 42 connect with the testing contacts 30 (FIG. 1) of the interposer 22. As noted above, the testing connector 42 need not incorporate a testing contact 44 for every chip pad. The contacts 44 may connect to the chips through a multiplexer or similar device (not shown). In addition, the testing connector 42 may be keyed to the shape of the wafer-interposer assembly 40 so that the wafer-interposer assembly 40 cannot be incorrectly inserted into the testing connector 42.

After electrical connection to the testing unit 46, the wafer-interposer assembly 40 can be run through a complete parametric test or whatever subset thereof is deemed necessary for that particular chip design. During the course of testing, each function of the chip may ideally be tested across a range of conditions, so as to simulate real world operation. The testing unit 46 may incorporate a heating and cooling apparatus for testing the chips across a range of temperatures. The testing unit 46 may also incorporate a device for vibrating or otherwise mechanically stressing the chips 14. During testing, non-conforming chips are identified by the testing unit 46 such that they may be discarded after singulation of the wafer-interposer assembly 40. Alternatively, where a manufacturer sells a variety of grades of a particular model of chip, individual chips can be graded according to various performance criteria, such as maximum clock speed or thermal stability, for later classification and sorting. Such parametric data and attribute data are stored by the testing unit 46 and may be displayed or printed for the operator. Other information such as operator identification code, date, lot number and the like will be stored.

Figure 4:
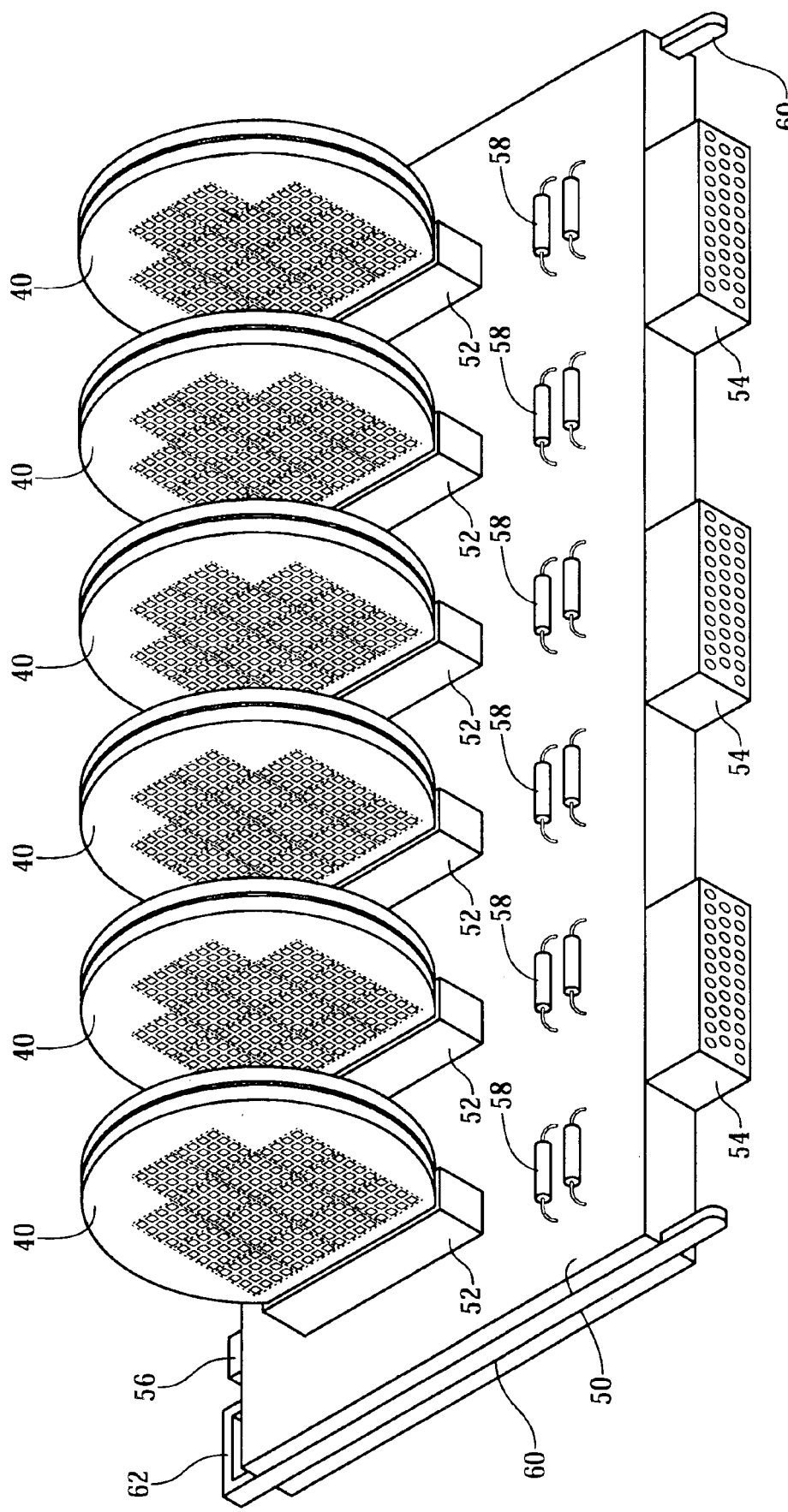
FIG. 4 is a perspective view of multiple wafer-interposer assemblies in a test fixture rack in accordance with the present invention.
Figure 5:
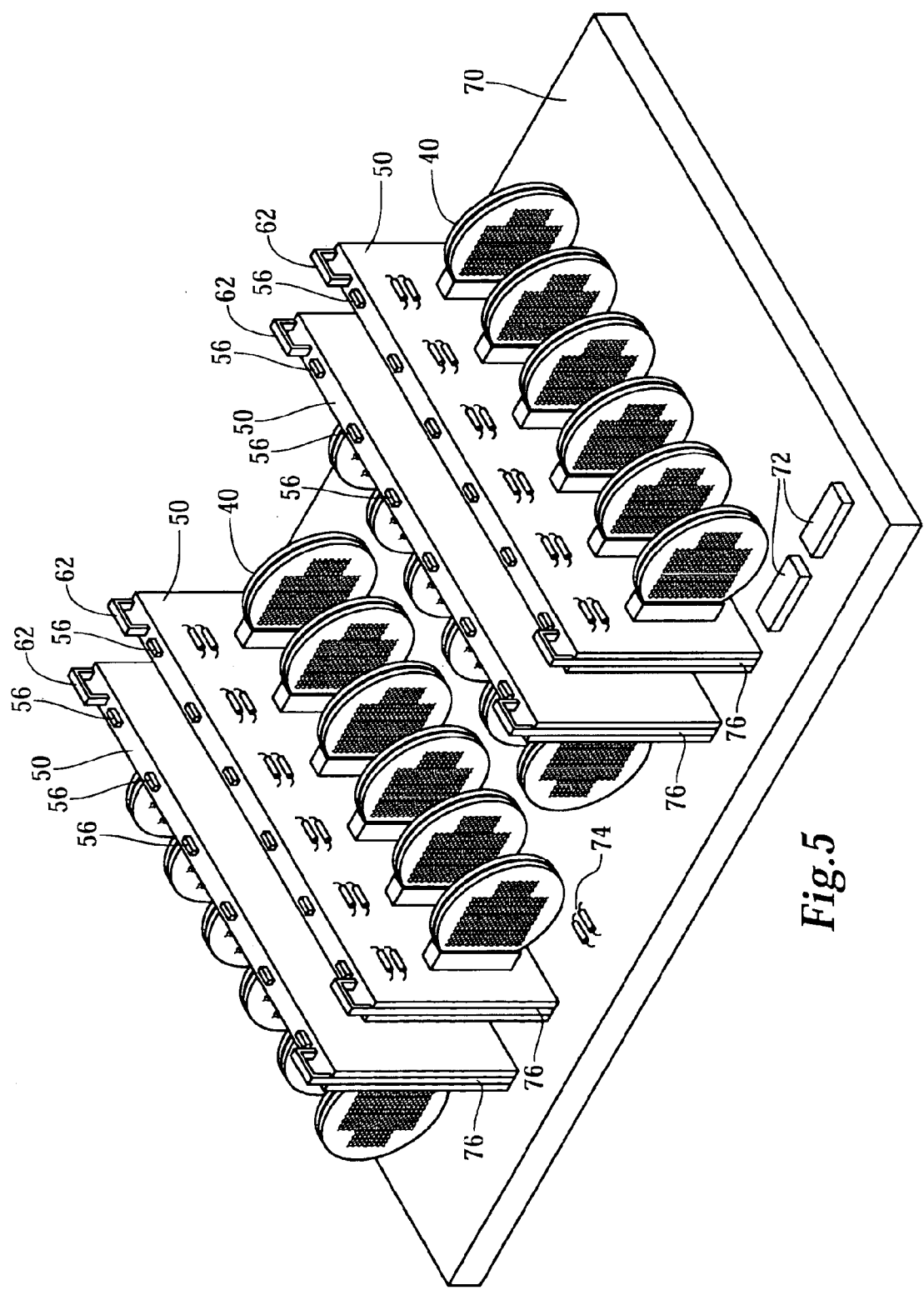
FIG. 5 is a perspective view of multiple test fixture racks in a test fixture bank in accordance with the present invention.

While FIG. 3 depicts a single wafer-interposer assembly 40 being tested, FIG. 4 depicts multiple wafer-interposer assemblies being tested in a rack, and FIG. 5 depicts multiple racks being tested in a bank configuration. It should be understood by those skilled in the art that groups of wafer-interposer assemblies could be tested using other topologies. In such a testing scenarios, additional multiplexers, capacitor, impedance matching networks and related components would typically be used.

FIG. 4 is a perspective view of multiple wafer-interposer assemblies 40 in a test fixture rack 50 in accordance with the present invention. The wafer-interposer assemblies 40 are removable connected to the test fixture rack 50 using connectors 52. The configuration and type of connector 52 can vary to accept different types of connections from a wafer-interposer assembly 40, such as edge connectors, pin and socket, add-on connectors, ribbon cable, RF connectors, optical and infrared, transmitted data, soldered connections, or quick release configurations. Moreover, the number and orientation of connectors 52 can vary depending on the size of the test fixture rack 50 and the wafer-interposer assemblies 40. For example, multiple rows and columns of connectors 52 can be used. In addition, connectors 52 may be keyed to the shape of the wafer-interposer assembly 40 so that the wafer-interposer assembly 40 cannot be incorrectly inserted into the connectors 52. Connectors 52 may also be individually keyed to interface specific types of wafer-interposer assembly 40, such as DRAM, microprocessor, DSP, etc. As a result several different types of wafer-interposer assembly 40 can be tested on a single test fixture rack 50. Alternatively, a test fixture rack 50 can have connectors 52 that only interface with one type of the wafer-interposer assembly 40.

The test fixture rack 50 also contains one or more test connectors 54. The configuration and type of the test connectors 54 can vary to accept different types of connections from a test device (not shown) or a test fixture bank 70 (FIG. 5), such as edge connectors, pin and scoket, add-on connectors, ribbon cable, RF connectors, optical and infrared, transmitted data, soldered connections, or quick release configurations. Moreover, the number and orientation of the test connectors 54 can vary depending on the size of the test device (not shown) or the test fixture bank 70 (FIG. 5) to which the test fixture rack 50 is to be connected. In addition, test connectors 54 may be keyed to the shape of the connections from a test device (not shown) or a test fixture bank 70 (FIG. 5) so that the test connectors cannot be incorrectly connected to the test device (not shown) or the test fixture bank 70 (FIG. 5). Multiplexers and switching circuitry (not shown) can be used in the test fixture rack backplane to logically address any given wafer-interposer assembly 40, and to map out wafer-interposer assemblies 40 that might contain serious defects so as not to over load the common power and signal busses.

The test fixture rack 50 also contains various discrete components 58, such as decoupling components, impedance matching components, protective devices, fuses, diodes, resistors, capacitors and other discrete semiconductor devices to enable performance testing by preserving signal integrity. In addition, the test fixture rack 50 itself contains semiconductor die, either packaged or flip chip or even wire bonded chip on board (not shown) and conductors (not shown) to enable testing of the wafer-interposer assemblies 40.

The test fixture rack 50 can also include status indicators 56, such as lights, light emitting diodes ("LED") or other display devices to provide visual indication that a particular wafer-interposer assembly 40 is being addressed, is in use, has completed testing, has a fault, or has been disabled by the test equipment. Typically, there will be one status indicator 56 for each wafer-interposer assembly 40 to tested by the test fixture rack 50. Other indications can be asserted by the test fixture rack 50 itself, should its built-in test (BIT) capability detect a problem or a need to alert the test equipment or operator. The test fixture rack 50 may also be assigned a serial number for performance tracking and addressing.

In addition, protective devices (not shown) in the test fixture rack 50, such as fuses or thermal sensors, can automatically shut down the test fixture rack 50 if a critical problem arises. The test fixture rack 50 can also accommodate environmental conditioning systems, such as vibration, cooling and/or heating. Moreover, the test fixture rack 50 can record the test results (such as a pass/fail map of the semiconductor die on the semiconductor wafer and speed grades), the numbers of hours the test fixture rack 50 has been in operation, and even disable itself based upon a user-programmed threshold until reset by authorized personnel. The test fixture rack 50 can also support protocols such as IEEE-488 for communication with control or reporting systems locally or remotely, such as over the company Intranet. Furthermore, the test fixture rack 50 can include positioning guides 60 to allow the test fixture rack 50 to be properly aligned and securely connected to a testing device (not shown) or a test fixture bank 70 (FIG. 5). The test fixture rack 50 can include handles 62 to allow the test fixture rack 50 to be easily inserted and removed from a testing device (not shown) or a test fixture bank 70 (FIG. 5).

FIG. 5 is a perspective view of multiple test fixture racks 50 in a test fixture bank 70 in accordance with the present invention. The test fixture racks 50 are removably connected to the test fixture bank 70 using connectors 54 (FIG. 4). The configuration and type of connector 54 (FIG. 4) can vary to accept different types of connections from a test fixture bank 70, such as edge connectors, pin and socket, add-on connectors, ribbon cable, RF connectors, optical and infrared, transmitted data, soldered connections, or quick release configurations. Moreover, the number and orientation of connectors 54 (FIG. 4) can vary depending on the size of the test fixture bank 70 and test fixture racks 50. The present invention is not limited to interfacing with only the four test fixture racks 50 shown or in the orientation shown.

The test fixture bank 70 also contains one or more test set interface connectors 72. The configuration and type of the test set interface connectors 72 can vary to accept different types of connections from a test device (not shown), such as edge connectors, pin and socket, add-on connectors, ribbon cable, RF connectors, optical and infrared, transmitted data, soldered connections, or quick release configurations. Moreover, the number and orientation of the test set interface connectors 72 can vary depending on the size of the test device (not shown) to which the test fixture bank 70 is to be connected. Multiplexers and switching circuitry (not shown) can be used in the test fixture bank backplane to logically address any given test fixture rack 50 or wafer-interposer assembly 40. Test set interface connectors 72 can also be used to connect the test fixture bank 70 to various peripheral devices, such as a printer, network connections, etc.

The test fixture bank 70 also contains various discrete components 74, such as decoupling components, impedance matching components, protective devices, fuses, diodes, resistors, capacitors and other discrete semiconductor devices to enable performance testing by preserving signal integrity. In addition, the test fixture bank 70 itself contains semiconductor die, either packaged or flip chip or even wire bonded chip on board (not shown) and conductors (not shown) to enable testing of the wafer-interposer assemblies 40 via the test fixture racks 50.

The test fixture bank 70 can also include status indicators (not shown), such as lights, light emitting diodes ("LED") or other display devices to provide visual indication that a particular test fixture rack 50 is being addressed, is in use, has completed testing, has a fault or has been disabled by the test equipment. Other indications can be asserted by the test fixture bank 70 itself, should its build-in test (BIT) capability detect a problem or a need to alert the test equipment or operator. The test fixture bank 70 may also be assigned a serial number for performance tracking and addressing.

In addition, protective devices (not shown) in the test fixture bank 70, such as fuses or thermal sensors, can automatically shut down the test fixture bank 70 if a critical problem arises. The test fixture bank 70 can also accommodate environmental conditioning systems, such as vibration, cooling and/or heating. Moreover, the test fixture bank 70 can record the test results (such as a pass/fail map of the semiconductor die on the semiconductor wafer and speed grades), the numbers of hours the test fixture bank 70 has been in operation, and even disable itself based upon a user-programmed threshold until reset by authorized personnel. The test fixture bank 70 can also support protocols such as IEEE-488 for communication with control or reporting systems locally or remotely, such as over a company Intranet. Furthermore, the test fixture bank 70 can include rack guides 76 to allow the test fixture racks 50 to be properly aligned and securely connected to the test fixture bank 70.

Figure 6:
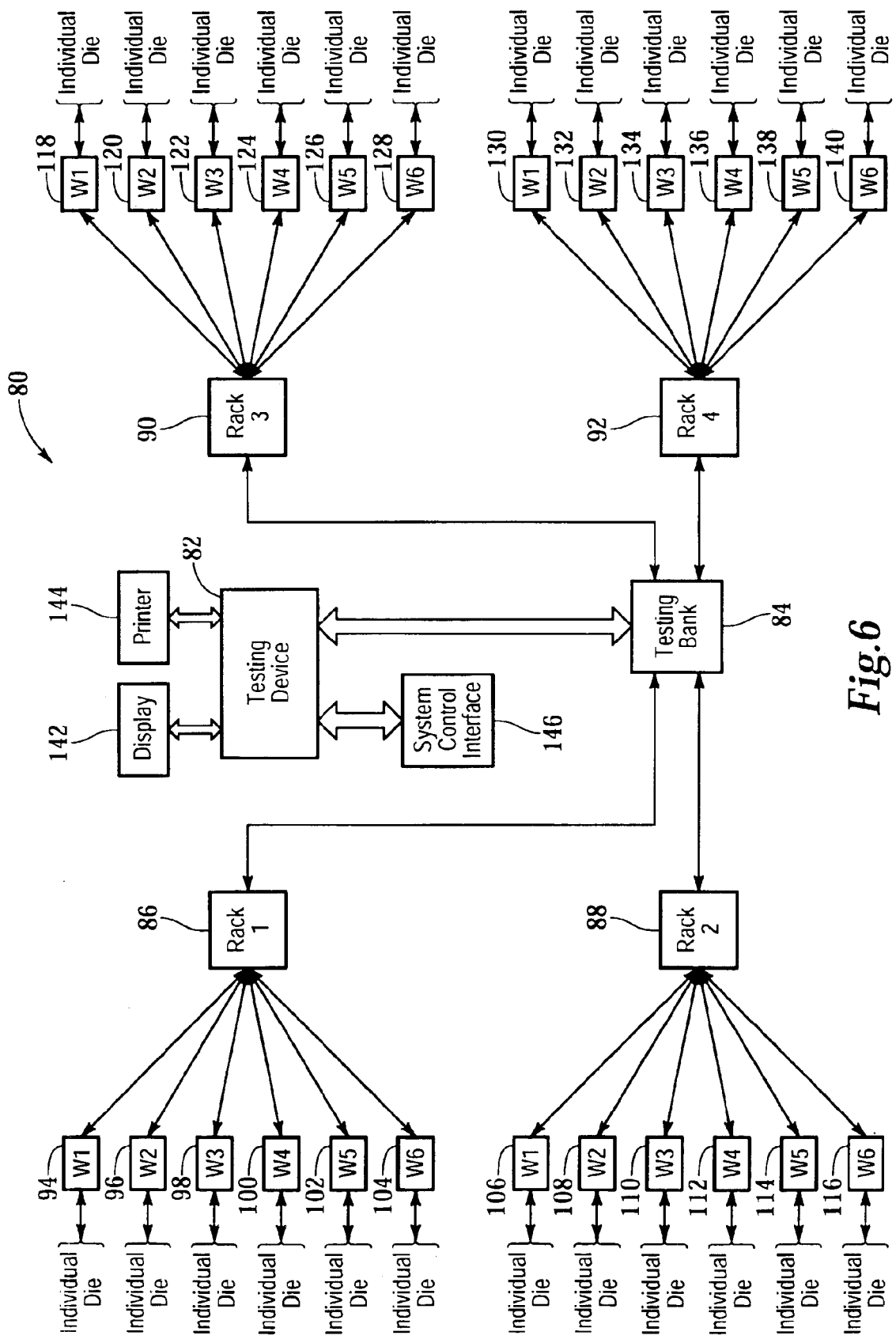
FIG. 6 is a block diagram of a testing system in accordance with the present invention.

FIG. 6 is a block diagram of a testing system 80 in accordance with the present invention. The testing system 80 may comprise a testing device 82 communicably connected to one or more test fixture banks 84, such as test fixture bank 70 illustrated in FIG. 5. Test fixture bank 84 is communicable connected to one or more test fixture racks 86, 88, 90 and 92, such as test fixture rack 50 illustrated in FIG. 4. Test fixture rack 86 is then communicably connected to one or more wafer-interposer assemblies 94, 96, 98, 100, 102 and 104, such as wafer-interposer assembly 40 illustrated in FIG. 3. Similarly, test fixture rack 88 is communicably connected to one or more wafer-interposer assemblies 106, 108, 110, 112, 114 and 116; test fixture rack 90 is communicably connected to one or more wafer-interposer assemblies 118, 120, 122, 124, 126 and 128; and test fixture rack 92 is communicably connected to one or more wafer-interposer assemblies 130, 132, 134, 136, 138 and 140. As previously described, each wafer-interposer assembly 94 through 140 is communicably connected with one or more semiconductor die. As a result, the testing device 82 can address and individually test each semiconductor die. The present invention is not limited to six wafer-interposer assemblies per test fixture rack or four test fixture racks per test fixture bank or one test fixture bank per testing system.

Testing device 82 can have various peripheral devices communicably connected to it by direct connection or through a network. The peripheral devices may be for input, output and/or control, such as display 142, printer 144 and system control interface 146. More specifically, the system control interface 146 allows the testing device 82 to be controlled and/or monitored by an automated process control system. The present invention thus eliminates the need to test each wafer-interposer assembly 94 through 140 individually. By loading multiple wafer-interposer assemblies 94 through 104, 106 through 116, 118 through 128, and 130 through 140 into multiple test fixture racks 86, 88, 90 and 92 respectively, and multiple racks into a test fixture bank 84, superior throughput and economies of scale are possible. Processing wafer-interposer assemblies in racks and banks further enables staging by, for example, preconditioning a rack in a cold temperature environment while another rack is undergoing test operations.

Figure 7:
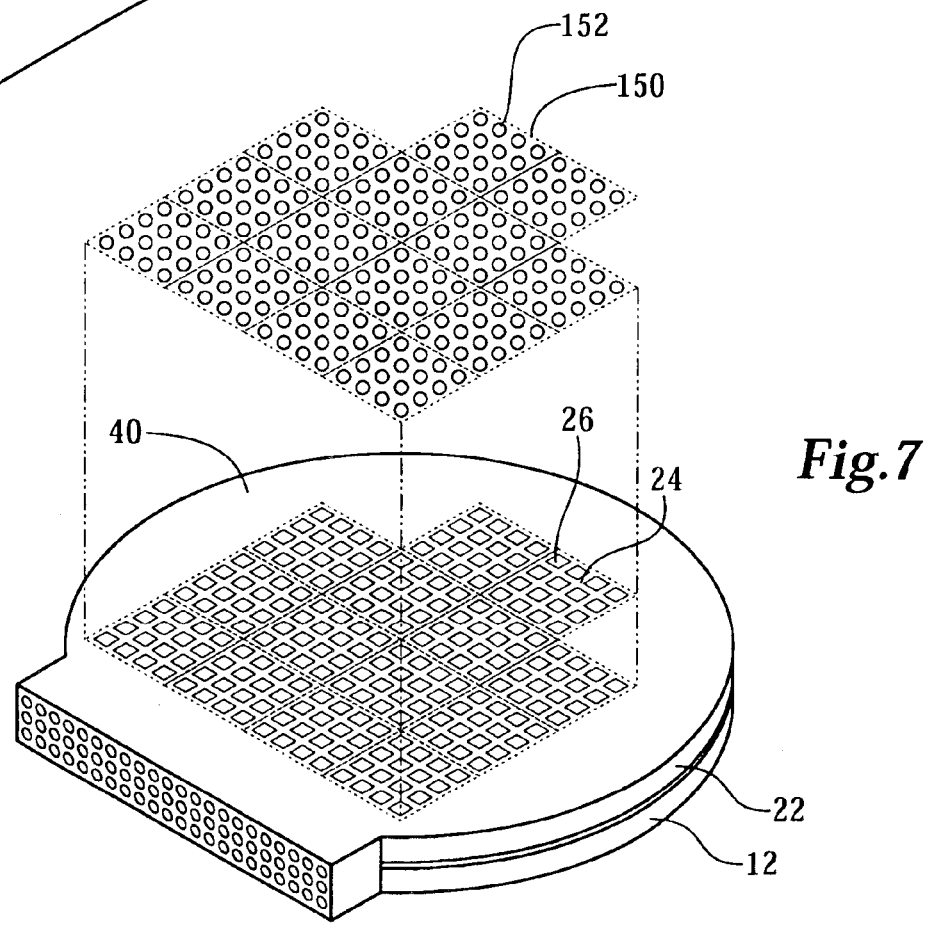
FIG. 7 is an exploded view of a wafer-interposer assembly having an array of conductive attachment elements disposed on the upper surface thereof in accordance with the present invention.

Now turning to FIG. 7, a wafer-interposer assembly 40 is shown having an array 24 of conductive pads 26 on its upper surface in accordance with the present invention. The array 150 of conductive attachment elements 152 may typically be attached to interposer 22 prior to its attachment to wafer 12. Alternatively, the conductive attachment elements 152 may not be attached to interposer 22 at all or may be attached to the interposer 22 following testing of chips 14 (FIG. 1) of wafer 12. The conductive attachment elements 152 may be of the types discussed above with reference to FIG. 1.

Figure 8:
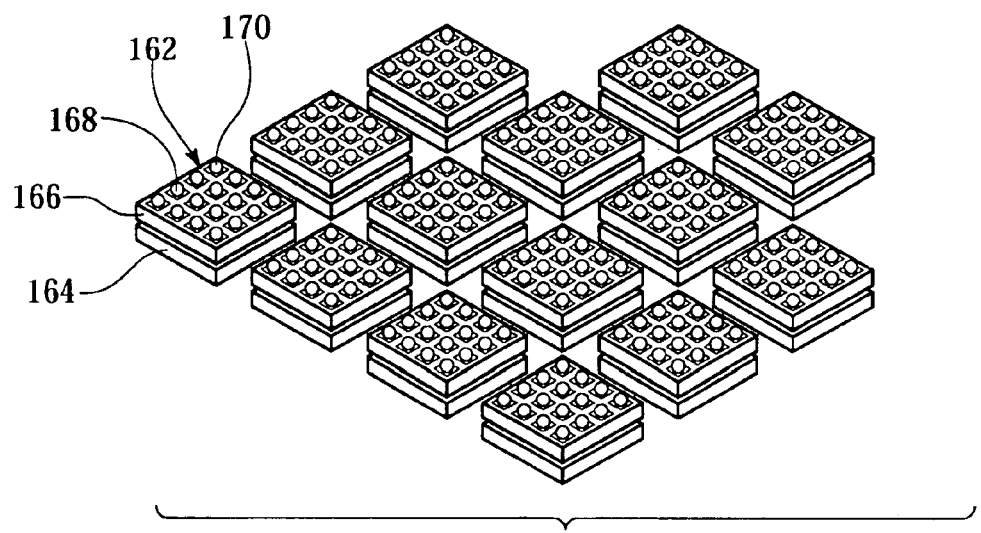
FIG. 8 is an isometric view of multiple chip assemblies after singulation of the wafer-interposer assembly in accordance with the present invention.

FIG. 8 shows an array of chip assemblies 162, after singulation of the wafer-interposer assembly 40 (FIG. 7) in accordance with the present invention. Each chip assembly 162 comprises a chip 164, an interposer 166 and one or more conductive attachment elements 170 deposited on the conductive pads 168 on the exposed surface of the interposer 166. The chip assemblies 162 will be separated into conforming and non-conforming groups or sorted by performance level according to the results of the wafer level testing described in accordance with FIG. 3. The wafer-interposer assembly 40 (FIG. 7) can be singulated into groups of chip assemblies 162 instead of individual die.

Figure 9:
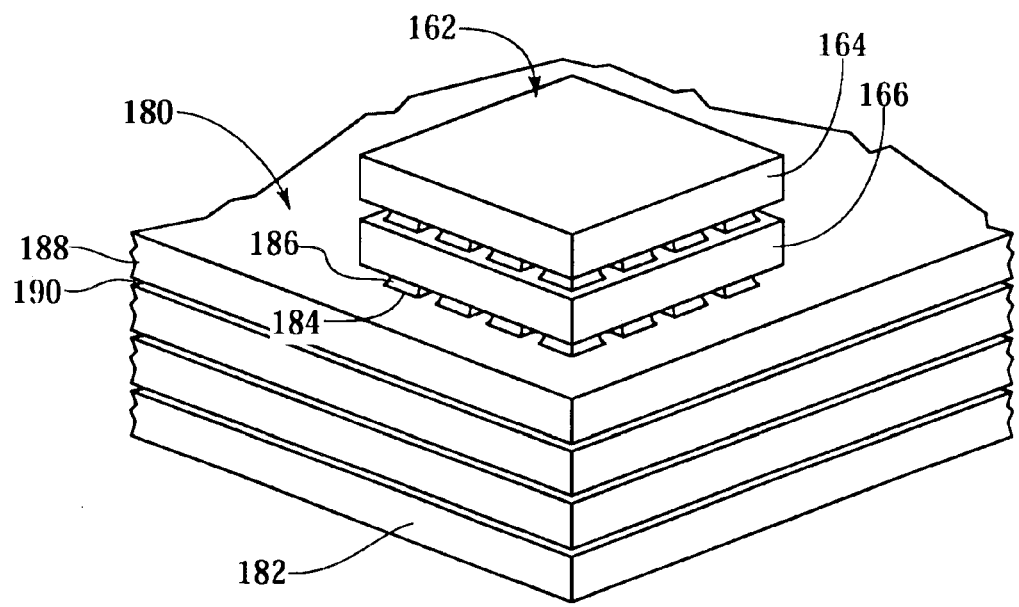
FIG. 9 is an isometric view of a chip assembly in place on a substrate in accordance with the present invention.

FIG. 9 shows an assembly 180 comprising a chip assembly 162 mounted on a substrate 182 having one or more conductive layers 190 and dielectric layers 188 in accordance with the present invention. The chip assembly 162 is electrically and mechanically attached to pads 184 on the surface of the substrate 182 through conductive attachment elements 186. The chip assembly 162 communicates with other electronic devices (not shown) through the conductive layers 190 of the substrate 182. Assembled as shown, the interposer 166 provide electrical connection between the chip 164 the substrate 182.

In certain embodiments, the substrate 182 may represent a traditional FR4 circuit board. In other embodiments, the substrate 182 may be composed of a higher grade material suitable for use in multichip modules requiring finer conductor pitch. In the latter embodiment, the chip assembly 162 would generally be one of several such assemblies mounted on a small substrate in close proximity. This invention is well suited for implementation in these assemblies. It can be seen in FIG. 9 that the chip assembly 162 occupies an area of substrate 182 only slightly larger than the surface of the chip 164. This is in contrast to traditional semiconductor assemblies, in which the area consumed by each chip package is much greater than the area of the chip itself.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A system for testing semiconductor die on multiple semiconductor wafers comprising:

a test fixture rack having connectors; and
at least two wafer-interposer assemblies, the wafer-interposer assemblies each including a semiconductor wafer having a plurality of semiconductor die and an interposer coupled to the semiconductor wafer, the interposer having a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

2. The system as recited in claim 1 wherein the test fixture rack further comprises discrete devices for enhancing testing of the semiconductor die.

3. The system as recited in claim 1 wherein the test fixture rack further comprises display devices that indicate a parameter associated with testing of the semiconductor die.

4. The system as recited in claim 1 wherein the test fixture rack further comprises a handle.

5. The system as recited in claim 1 further comprising at least one positioning guide attached to the test fixture rack.

6. The system as recited in claim 1 wherein the test fixture rack is operably couplable to a testing unit that performs parametric testing of at least a portion of the semiconductor die.

7. The system as recited in claim 1 wherein the test fixture rack is operably couplable to a testing unit that performs sequential testing of at least a portion of the semiconductor die.

8. The system as recited in claim 1 wherein the test fixture rack is operably couplable to a testing unit that performs simultaneous testing of at least a portion of the semiconductor die.

9. The system as recited in claim 1 wherein the test fixture rack is operably couplable to a testing unit that performs vibrational and mechanical stress testing on at least a portion of the semiconductor die.

10. The system as recited in claim 1 wherein the test fixture rack is operably couplable to a test fixture bank.

11. The system as recited in claim 10 wherein test fixture bank is operably couplable to a testing unit.

12. A system for testing semiconductor die on multiple semiconductor wafers comprising:
a test fixture bank;
at least two test fixture racks operably coupled to the test fixture bank, each of the test fixture racks having connectors; and
at least two wafer-interposer assemblies operably coupled to each of the test fixture racks, the wafer-interposer assemblies each including a semiconductor wafer having a plurality of semiconductor die and an interposer coupled to the semiconductor wafer, the interposer having a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

13. The system as recited in claim 12 wherein each of the test fixture racks further comprises discrete devices for enhancing testing of the semiconductor die.

14. The system as recited in claim 12 wherein each of the test fixture racks further comprises display devices that indicate a parameter associated with testing of the semiconductor die.

15. The system as recited in claim 12 wherein each of the test fixture racks further comprises a handle.

16. The system as recited in claim 12 further comprising at least one positioning guide attached to each of the test fixture racks for aligning the test fixture racks with the test fixture bank.

17. The system as recited in claim 12 wherein the test fixture bank is operably couplable to a testing unit that performs parametric testing of at least a portion of the semiconductor die.

18. The system as recited in claim 12 wherein the test fixture bank is operably couplable to a testing unit that performs sequential testing of at least a portion of the semiconductor die.

19. The system as recited in claim 12 wherein the test fixture bank is operably couplable to a testing unit that performs simultaneous testing of at least a portion of the semiconductor die.

20. The system as recited in claim 12 wherein the test fixture bank is operably couplable to a testing unit that performs vibrational and mechanical stress testing on at least a portion of the semiconductor die.

21. A system for testing semiconductor die on multiple semiconductor wafers comprising:
a testing unit;
a test fixture bank operably coupled to the testing unit;
at least two test fixture racks operably coupled to the test fixture bank, each of the test fixture racks having connectors; and
at least two wafer-interposer assemblies operably coupled to each of the test fixture racks, the wafer-interposer assemblies each including a semiconductor wafer having a plurality of semiconductor die and an interposer coupled to the semiconductor wafer, the interposer having a first set of conductors for electrically connecting the semiconductor die of the semiconductor wafer to a substrate and a second set of conductors that electrically connect the semiconductor die of the semiconductor wafer to the test fixture rack via one of the connectors, thereby providing for addressing and testing of the semiconductor die.

22. The system as recited in claim 21 wherein each of the test fixture racks further comprises discrete devices for enhancing testing of the semiconductor die.

23. The system as recited in claim 21 wherein each of the test fixture racks further comprises display devices that indicate a parameter associated with testing of the semiconductor die.

24. The system as recited in claim 21 wherein each of the test fixture racks further comprises a handle.

25. The system as recited in claim 21 further comprising at least one positioning guide attached to each of the test fixture racks for aligning the test fixture racks with the test fixture bank.

26. The system as recited in claim 21 wherein the testing unit performs parametric testing of at least a portion of the semiconductor die.

27. The system as recited in claim 21 wherein the testing unit performs sequential testing of at least a portion of the semiconductor die.

28. The system as recited in claim 21 wherein the testing unit performs simultaneous testing of at least a portion of the semiconductor die.

29. The system as recited in claim 21 wherein the testing unit performs vibrational and mechanical stress testing on at least a portion of the semiconductor die.

* * * * *